United States Patent
Schlage et al.

(10) Patent No.: US 10,998,131 B2
(45) Date of Patent: May 4, 2021

(54) MULTILAYER DEVICE HAVING AN IMPROVED ANTIFERROMAGNETIC PINNING LAYER AND A CORRESPONDING MANUFACTURING METHOD

(71) Applicant: Deutsches Elektronen-Synchrotron DESY, Hamburg (DE)

(72) Inventors: Kai Schlage, Schenefeld (DE); Tatiana Gurieva, Hamburg (DE); Svenja Willing, Seevetal (DE); Lars Bocklage, Hamburg (DE); Ralf Röhlsberger, Jesteburg (DE)

(73) Assignee: Deutsches Elektronen-Synchrotron DESY, Hamburg (DE)

( * ) Notice: Subject to any disclaimer, the term of this patent is extended or adjusted under 35 U.S.C. 154(b) by 0 days.

(21) Appl. No.: 16/449,567

(22) Filed: Jun. 24, 2019

(65) Prior Publication Data
US 2019/0392990 A1  Dec. 26, 2019

(30) Foreign Application Priority Data

Jun. 25, 2018  (EP) .................................. 18179692

(51) Int. Cl.
| | |
|---|---|
| *G11C 11/00* | (2006.01) |
| *H01L 29/76* | (2006.01) |
| *G11C 11/14* | (2006.01) |
| *H01F 41/32* | (2006.01) |
| *G01R 33/09* | (2006.01) |

(Continued)

(52) U.S. Cl.
CPC ........... *H01F 41/32* (2013.01); *G01R 33/093* (2013.01); *H01F 10/3268* (2013.01); *H01F 10/3286* (2013.01); *H01L 43/02* (2013.01); *H01L 43/12* (2013.01)

(58) Field of Classification Search
CPC ..... H01L 43/12; H01F 41/308; H01F 10/324; B82Y 25/00; B82Y 40/00; B82Y 10/00; G01R 33/093

See application file for complete search history.

(56) References Cited

U.S. PATENT DOCUMENTS

| | | | | |
|---|---|---|---|---|
| 5,936,293 A | * | 8/1999 | Parkin .................... | G01R 33/06 257/422 |
| 6,004,654 A | * | 12/1999 | Shinjo .................... | B82Y 10/00 324/252 |

(Continued)

OTHER PUBLICATIONS

Communication dated Jan. 4, 2019, from the European Patent Office for corresponding European application No. EP 18179692.1.

*Primary Examiner* — Brian Turner
(74) *Attorney, Agent, or Firm* — Harness, Dickey & Pierce, P.L.C.

(57) ABSTRACT

A method of producing a multilayer device, such as a multilayer magnetoelectronic device, and a device with an improved magnetic pinning. The device includes a multilayer structure including an antiferromagnetic pinning layer and one or more ferromagnetic layers. Each of the ferromagnetic layers has a boundary surface with the antiferromagnetic layer. The antiferromagnetic layer is deposited at a nonzero angle of incidence with respect to a direction perpendicular to the plane of extension of the antiferromagnetic pinning layer. This oblique incidence deposition gives rise to a surface roughness of the antiferromagnetic pinning layer which is described by a plane wave function.

15 Claims, 4 Drawing Sheets

(51) Int. Cl.
*H01F 10/32* (2006.01)
*H01L 43/02* (2006.01)
*H01L 43/12* (2006.01)

(56) References Cited

U.S. PATENT DOCUMENTS

| | | | |
|---|---|---|---|
| 6,292,389 B1* | 9/2001 | Chen | B82Y 10/00 |
| | | | 257/295 |
| 6,597,547 B1* | 7/2003 | Kawawake | B82Y 10/00 |
| | | | 360/324.11 |
| 2003/0021908 A1* | 1/2003 | Nickel | C23C 14/5833 |
| | | | 427/551 |
| 2004/0086752 A1* | 5/2004 | Matsukawa | H01F 41/302 |
| | | | 428/811.5 |
| 2004/0087037 A1 | 5/2004 | Berg et al. | |
| 2006/0126371 A1* | 6/2006 | Nagase | G11C 11/16 |
| | | | 365/145 |
| 2011/0139606 A1 | 6/2011 | Tsunekawa et al. | |
| 2012/0244640 A1 | 9/2012 | Ohsawa et al. | |

* cited by examiner

MULTILAYER DEVICE HAVING AN IMPROVED ANTIFERROMAGNETIC PINNING LAYER AND A CORRESPONDING MANUFACTURING METHOD

CROSS-REFERENCE TO RELATED APPLICATIONS

This application claims the benefit and priority of European Patent Application No. EP18179692.1 filed Jun. 25, 2018, the disclosure of which is incorporated by reference as if fully set forth in detail herein.

FIELD

The present disclosure relates to a method of producing a multilayer device including an antiferromagnetic pinning layer and at least one ferromagnetic layer, such as, in particular, a multilayer magnetoelectronic or magnetooptical device. The present application further relates to a multilayer device producible by such a method.

BACKGROUND

In the case of multilayer magnetoelectronic devices, such multilayer devices often make use of magnetoresistance, which is the effect that the electrical resistance of a magnetic multilayer system is dependent on the relative orientation of two adjacent magnetic layers, which are typically separated by a non-magnetic spacer layer. This effect is used, for example, by so called spin valves which are magnetoelectronic devices comprising a layer system with at least two adjacent ferromagnetic layers. The ferromagnetic layers are conditioned, so that their magnetization is anisotropic. The classic spin valve can selectively assume at least an open state and a closed state and may also selectively assume one or more intermediate states. Thus, the classic spin valve is used to either selectively switch between an open and a closed state or to detect the angle of an external rotary magnetic field by assuming an intermediate state with a corresponding opening angle. In the open state the magnetization of two adjacent ferromagnetic layers is parallel to each other, resulting in a low electric resistance, for example perpendicular to the layers. In the closed state the magnetization of two adjacent ferromagnetic layers is antiparallel to each other. The electric resistance in the closed state is much larger than in the open state.

In applications the layers of such spin valves are structured in such a way as to allow the spin valve to open or close depending on external magnetic fields. This is achieved by allowing one ferromagnetic layer to be susceptible to external magnetic fields and change its magnetic orientation accordingly, while the other ferromagnetic layer must be fixed in its magnetic orientation and remain static. The electric resistance of this device is thus sensitive to the external magnetic fields to which it is exposed. Hence this type of device is also known as a magnetic field sensor. However, providing such a fixed or static ferromagnetic layer may also be advantageous for other types of devices.

In any case, to be useful in practice the magnetic orientation of the fixed or static ferromagnetic layer must be resistant to external magnetic fields up to high field values. This can be achieved by pinning the ferromagnetic layer to an antiferromagnetic layer. The ferromagnetic layer is deposited directly onto the antiferromagnetic layer, resulting in a boundary surface between the two layers. The antiferromagnetic layer, whose net magnetization is zero, induces an exchange bias in the ferromagnetic layer. The exchange bias results in a preferred unidirectional anisotropy in the magnetization of the adjacent pinned ferromagnetic layer. The biasing effect results in a shifting of the entire hysteresis curve of the pinned ferromagnetic layer.

As it is the goal to make spin valves and other types of magnetic devices, such as other types of magnetoelectronic devices, as stable and robust as possible under adverse conditions such as high temperatures and external magnetic fields, it is necessary to define a measurable value which reflects the desired attributes.

Coercivity is a measure to determine the external magnetic force a magnet can withstand before it is demagnetized. Thus, the coercivity or coercive field value gives information about the so-called hardness of the magnet, i.e. the larger the external magnetic field is which must be applied to demagnetize the magnet, the larger the "magnetic hardness" of said magnet. As already noted above, pinning a ferromagnet to an antiferromagnet induces an exchange bias in the ferromagnet, resulting in a preferred unidirectional anisotropy. The magnetic hardness in the direction opposite to the direction of this preferred unidirectional anisotropy of a pinned ferromagnet, i.e. the magnetic hardness with respect to external magnetic fields extending opposite or antiparallel to the direction of the preferred unidirectional anisotropy, is greater than that of an equivalent ferromagnet which is not pinned to an antiferromagnet.

This is reflected in the corresponding hysteresis curve of a pinned ferromagnetic layer, i.e. the hysteresis curve measured with respect to external magnetic fields extending—in a parallel or antiparallel manner—along the direction or axis of the preferred unidirectional anisotropy. The entire curve is shifted in one direction, resulting in a higher coercive field value in said direction. The amount by which the center of the hysteresis curve is shifted compared to the corresponding hysteresis curve of a system, in which the ferromagnetic layer is not pinned, is a measure of the exchange bias.

The hysteresis curve of the pinned layer is not necessarily only shifted, but can also be severely distorted, the demagnetization being carried out more gradually than a regular hysteresis curve. In this case the coercive field value of the pinned ferromagnetic layer or the exchange bias are not good indicators for the usability of the multilayer device.

A measurable value which reflects the usability of the device with the pinned ferromagnetic layer is the size of the usable regime. The useable regime is defined herein as the range of all external magnetic fields which are oriented parallel or antiparallel to the direction of the unidirectional anisotropy of the pinned ferromagnetic layer and for which the magnetization of the pinned ferromagnetic layer drops no lower than 90% of the remanent value. The maximal field value of the usable regime in the antiparallel direction, i.e. the value or strength of that external magnetic field, which is oriented antiparallel to the direction of unidirectional anisotropy of the pinned ferromagnetic layer and for which the magnetization of the pinned ferromagnetic layer drops to 90% of the remanent value, is defined herein as the absolute magnetic field value.

SUMMARY

It is an objective of the present invention to provide a method of producing a multilayer device of the above type—and, in particular, a multilayer magnetoelectronic device—with an increased usable regime and hence a high absolute magnetic field value. It is a further objective of the present invention to provide a corresponding multilayer device, which is producible by the method.

This objective is achieved by a method as claimed in claim 1 and by a device as claimed in claim 11. Preferred embodiments of the method and of the device are the subject-matter of the respective dependent claims.

According to the invention a method of producing a multilayer device or multilayer magnetic device, such as, in particular, a multilayer magnetoelectronic device—for example a magnetic field sensor or spin valve—or also a multilayer magnetooptical device, comprises depositing a multilayer structure including an antiferromagnetic pinning layer and one or more ferromagnetic layers, disposed one on top of the other such that each of these one or more ferromagnetic layers is disposed on the same side of the antiferromagnetic pinning layer and a first one of these one or more ferromagnetic layers has a boundary surface with the antiferromagnetic layer. The first ferromagnetic layer is pinned by the antiferromagnetic pinning layer such that it has a unidirectional magnetic anisotropy having an orientation determined or fixed by the antiferromagnetic pinning layer and is therefore also referred to as pinned ferromagnetic layer. It should be noted that, in addition to this first or pinned ferromagnetic layer, the above-mentioned one or more ferromagnetic layers may or may not comprise one or more further or second ferromagnetic layers. It should also be noted that, in addition to the above-mentioned one or more ferromagnetic layers, i.e. the first and second ferromagnetic layers, the device may or may not comprise one or more further or third ferromagnetic layers on the opposite side of the antiferromagnetic pinning layer and/or on the side of the antiferromagnetic pinning layer on which the first ferromagnetic layer is disposed.

Like any antiferromagnetic layer, the antiferromagnetic pinning layer has a net magnetization of zero, which is due to the antiferromagnet being composed of magnetic sublattices whose magnetizations cancel each other out. In the device the preferred magnetic directions of the sublattices extend in the plane defined by the antiferromagnetic pinning layer and have an overall preferred magnetic direction, i.e. the respective magnetic moment has a preferred direction also called the easy axis. Depending on, amongst others, the thickness of the antiferromagnetic pinning layer, this applies throughout the entire thickness of the antiferromagnetic pinning layer or only to a subregion or sublayer of the antiferromagnetic pinning layer directly adjacent to the first or pinned ferromagnetic layer. In this regard it is to be noted that when not taking particular measures during production of the device, after deposition the antiferromagnetic pinning layer may be polycrystalline and then typically comprises grains with random orientations of the magnetization of the sublattices. In other words, inside of each individual grain, the sublattices display magnetic anisotropy with the magnetic moment of each sublattice having a preferred direction and the magnetic moments of the two sublattices being antiparallel to each other. However, overall, the magnetic anisotropies or moments of the sublattices may have a random orientation among the different grains. In order to obtain an overall preferred magnetic direction of the sublattices extending in the plane defined by the antiferromagnetic pinning layer, the adjacent ferromagnetic layer is preferably used, i.e. the first or pinned ferromagnetic layer. More specifically, the first ferromagnetic layer can be easily provided with a unidirectional anisotropy or magnetization, e.g. by applying an external magnetic field during its deposition or by carrying out a subsequent annealing and cooling step. This unidirectional magnetization is then passed onto the antiferromagnetic pinning layer or at least to a subregion or sublayer of the antiferromagnetic pinning layer directly adjacent to the first or pinned ferromagnetic layer, either directly during the deposition in an external magnetic field or by means of annealing, which involves heating above the Neel temperature, followed by cooling in an external magnetic field to align the magnetization of the first ferromagnetic layer such that it exhibits unidirectional anisotropy. The latter process is also referred to as field cooling.

As noted above, the first or pinned ferromagnetic layer displays unidirectional magnetic anisotropy, that is the net magnetic moment has a preferred direction or easy axis, which preferably extends in the plane defined by the first ferromagnetic layer. More specifically, as already explained above, the unidirectional magnetic anisotropy of the first ferromagnetic layer is induced by the antiferromagnetic pinning layer and can be achieved or ensured by, in particular, application of an external magnetic field during deposition and/or annealing and field cooling treatment subsequent to deposition. In case the device comprises one or more second and/or third ferromagnetic layers, one or more or all of the second and/or third ferromagnetic layers may display no anisotropy, in-plane anisotropy or uniaxial anisotropy in the plane defined by the respective layer, in particular uniaxial anisotropy parallel or antiparallel to the one of the first ferromagnetic layer.

One of the first ferromagnetic layer and the antiferromagnetic pinning layer, and preferably the antiferromagnetic pinning layer, is deposited at a respective azimuthal angle with respect to a reference direction extending in the plane of extension of the respective layer and at a nonzero angle of incidence with respect to a direction perpendicular to the plane of extension of the respective layer. This type of deposition is also referred to as oblique incidence deposition or OID. The azimuthal angle is the angle between the projection of the path of the particles being deposited onto the plane of the respective layer and a reference direction extending in the plane of the respective layer. The angle of incidence is the angle between the path of the particles being deposited and a direction perpendicular to the plane of the respective layer. It has been surprisingly found that producing the first ferromagnetic layer or, in particular, producing the antiferromagnetic pinning layer in this manner not only results in a magnetic anisotropy of the first ferromagnetic layer determined by the angle of incidence and by the azimuthal angle, but also has the result that the antiferromagnetic pinning layer has a considerably increased pinning effect, i.e. the strength of the pinning is considerably enhanced by depositing the first ferromagnetic layer or, in particular, the antiferromagnetic pinning layer by means of oblique incidence deposition. In other words, depositing the first ferromagnetic layer or, in particular, the antiferromagnetic pinning layer at a nonzero angle of incidence gives rise to a stronger exchange bias in the first or pinned ferromagnetic layer, than an antiferromagnetic pinning layer produced by zero angle deposition. Any other process step supporting the magnetic anisotropy of the combination of the antiferromagnetic pinning layer and the adjacent first or pinned ferromagnetic layer, such as the above-described application of an external magnetic field during deposition and/or subsequent annealing involving field cooling, are then carried out in a way that they strengthen the preferred direction defined by the azimuthal angle.

It has also been found that the first ferromagnetic layer or the antiferromagnetic pinning layer deposited in this manner displays a characteristic surface roughness which can be described by a plane wave function.

By contrast, the other one of the first ferromagnetic layer and the antiferromagnetic pinning layer may be deposited onto the above layer, which is deposited by oblique incidence deposition, by means of zero angle deposition or likewise by oblique incidence deposition. Thus, for example, if the antiferromagnetic pinning layer is deposited by oblique incidence deposition, the first or pinned ferromagnetic layer may be deposited onto the antiferromagnetic pinning layer either by zero angle deposition or by oblique incidence deposition.

This method provides the advantage that the multilayer device produced by the method, which may be, in particular, a multilayer magnetoelectronic device, has a hysteresis curve that is much more square-like and hence exhibits an extended usable regime and a very high absolute magnetic field value as compared to conventional devices. Thus, overall, the device produced by said method has an improved antiferromagnetic pinning layer enabling the realization of a device showing an improved stable behavior under various environmental conditions, such as in various temperatures and external magnetic fields.

In a preferred embodiment, the angle of incidence is greater than 45°, preferably greater than 50°, and more preferably greater than 55°. It has been found that the absolute magnetic field value depends nonlinearly on the angle of incidence.

In a preferred embodiment, the angle of incidence is less than 75°, preferably less than 70° and more preferably less than 65°. Values of about 60° proved most promising for antiferromagnetic pinning layers composed of iridium-manganese as well as platinum-manganese, though the most effective angle of incidence may generally depend on the chosen antiferromagnetic material.

In a preferred embodiment, the antiferromagnetic pinning layer is chosen from the group consisting of the alloys platinum-manganese and iridium-manganese and of manganese nitride. Platinum-manganese has produced promising results, though iridium-manganese is more cost efficient. An example of a platinum-manganese alloy is Pt(50 at %)Mn (50 at %), and an example of an iridium-manganese alloy is Ir(20 at %)Mn(80 at %). Generally, the properties of the device depend on the exact composition of the antiferromagnetic pinning layer.

In a preferred embodiment, the first or pinned ferromagnetic layer, and preferably also each of the one or more ferromagnetic layers, is chosen from the group consisting of Cobalt, Iron, Boron, Nickle and alloys thereof, preferably the alloy Cobalt-Iron-Boron. An example of a Cobalt-Iron-Boron alloy is Co(20 at %)Fe(60 at %)B(20 at %). Generally, any thermodynamically stable alloy may be used containing elements that order ferromagnetically in the alloy such that an effective magnetic moment of the corresponding layer results.

In a preferred embodiment, the thickness of the antiferromagnetic pinning layer is 30 nm or less and more preferably 25 nm or less. The preferred thickness strongly depends on the antiferromagnetic material used. For example, in a preferred embodiment with iridium-manganese, the antiferromagnetic layer has a thickness of 20 nm or less, preferably 18 nm or less, more preferably 15 nm or less, even more preferably 8 nm or less, and most preferably 6 nm or less. In a preferred embodiment with platinum-manganese the layers are thicker. Experiments have shown a correlation between the thickness of the antiferromagnetic layer and the exchange bias. While conventionally, zero angle deposited antiferromagnetic layers show a stronger pinning effect for thicker layers, the reverse is true for antiferromagnetic layers produced by oblique incidence deposition. In this regard it is to be noted that the multilayer structure may comprise adjacent layers of the same material. For example, if the antiferromagnetic pinning layer is deposited by oblique incidence deposition, it may be arranged directly adjacent to a further antiferromagnetic layer, which is produced by zero angle deposition and is disposed on the side of the antiferromagnetic pinning layer opposite the first or pinned ferromagnetic layer.

In a preferred embodiment, the multilayer structure is annealed after deposition in vacuum and subsequently cooled down in a magnetic field to achieve the above-described annealing involving field cooling. The annealing time and temperature have to be chosen in a way that the magnetic moments in the antiferromagnet reorder in the direction induced by the first ferromagnetic layer. The annealing process influences the absolute magnetic field value provided by the first or pinned ferromagnetic layer. Generally, longer annealing times at lower temperatures have proven preferable to shorter annealing times at high temperatures.

In a preferred embodiment, the deposition of the first or pinned ferromagnetic layer and/or the deposition of the antiferromagnetic pinning layer is carried out by means of ion beam deposition or physical vapor deposition, preferably by magnetron sputter deposition. Ideal sputter deposition parameters strongly depend on the materials used.

In a preferred embodiment, the multilayer structure is deposited onto a chemically inert, nonmagnetic substrate. It may be deposited directly onto the substrate, or a seed or buffer layer may be arranged between the substrate and the multilayer structure such that it is in contact with both the substrate and the antiferromagnetic layer. A respective seed layer may also be arranged directly adjacent to one or more of the ferromagnetic layers. The seed layers can aid in modifying the crystalline structure and surface roughness of the deposited layers and thereby influence the magnetic properties of the system.

In a preferred embodiment, the antiferromagnetic pinning layer is combined with a synthetic antiferromagnet comprising two ferromagnetic layers separated by a thin spacer layer that results in an interlayer exchange coupling of the two ferromagnetic layers. One of the two ferromagnetic layers of the synthetic antiferromagnet is the first or pinned ferromagnetic layer, and the other of the two ferromagnetic layers of the synthetic antiferromagnet is one of the above-mentioned second ferromagnetic layers. This combination of the antiferromagnetic pinning layer and the synthetic antiferromagnet enhances the absolute magnetic field value and the useable regime even further.

In a preferred embodiment, the one or more ferromagnetic layers comprise multiple ferromagnetic layers—i.e. one or more second ferromagnetic layers in addition to the first or pinned ferromagnetic layer—disposed one on top of the other, wherein each two adjacent ones of these ferromagnetic layers are separated by a respective nonmagnetic layer. Preferably one of the ferromagnetic layers, namely the first ferromagnetic layer, is pinned to the antiferromagnetic pinning layer, while the adjacent ferromagnetic layer or layers is or are susceptible to external magnetic fields, i.e. can be oriented more or less freely by the external magnetic fields. Depending on whether the multilayer structure is meant to utilize the giant magnetoresistance effect or the tunnel magnetoresistance effect, the respective nonmagnetic layer is electrically conductive or electrically insulating. Preferably at least one of the first and second ferromagnetic layers is deposited at a respective azimuthal angle with respect to a reference direction extending in the plane of extension of the respective ferromagnetic layer and at a nonzero angle of incidence with respect to a direction perpendicular to the plane of extension of the respective ferromagnetic layer. The same also applies to possible third ferromagnetic layers mentioned above.

In a preferred embodiment the multilayer device or multilayer magnetic device is a magnetoelectronic device and, in particular, a magnetic field sensor. Such a magnetic field sensor can be a spin valve utilizing either the giant magnetoresistance effect or the tunnel magnetoresistance effect to measure external magnetic fields.

The above-described method of producing a multilayer device or multilayer magnetic device can be advantageously utilized to produce a device having the configuration of any of the embodiments described in detail above, in particular a magnetoelectronic device. Thus, to summarize briefly, the device comprises a multilayer structure including an antiferromagnetic pinning layer and one or more ferromagnetic layers, disposed one on top of the other such that each of the at least one ferromagnetic layer is disposed on the same side of the antiferromagnetic pinning layer. A first one of the one or more ferromagnetic layer has a boundary surface with the antiferromagnetic pinning layer and constitutes a pinned ferromagnetic layer. The absolute magnetic field value and the usable regime of the device are enhanced. For example, the absolute magnetic field value may be greater than 55 mT for iridium-manganese with a first or pinned ferromagnetic layer having a thickness of more than 5 nm. As explained above, the absolute magnetic field value marks the point in the hysteresis curve at which the magnetization of the pinned ferromagnetic layer drops to 90% of the remanent value, wherein the hysteresis curve is measured for external magnetic fields extending parallel and antiparallel to the direction of unidirectional anisotropy of the pinned ferromagnetic layer. In a preferred embodiment, the antiferromagnetic pinning layer comprises or consists of a platinum-manganese alloy. Devices produced by this method and comprising platinum-manganese have shown absolute magnetic field values of up to 90 mT with first or pinned ferromagnetic layers having a thickness of more than 5 nm. It should be noted that thinner ferromagnetic layers and/or the addition of a synthetic antiferromagnet can further strongly increase the absolute magnetic field values.

More specifically, the above method of producing a multilayer device can be advantageously utilized to produce a device comprising a multilayer structure as described above, wherein the boundary surface has a surface roughness, which can be characterized by a plane wave function propagating in the direction extending in the plane of extension of the respective antiferromagnetic pinning layer, the periodic function having an amplitude A and a wavelength λ, and thus also a frequency f. The periodic surface roughness is induced by the oblique incidence deposition of the antiferromagnetic pinning layer or the first antiferromagnetic layer. The direction of propagation of the plane wave function, or the plane waves, is parallel to the projection of the direction of incidence onto the respective layer during the oblique incidence deposition. It should be noted that when annealing and field cooling are employed during production of the device, the external magnetic field applied during field cooling should be perpendicular to this direction of propagation in order to support the magnetic anisotropy induced by the oblique incidence deposition.

In a preferred embodiment, the amplitude A of the plane wave function is 0.5 to 6 nm, more preferably 0.5 to 4 nm, and even more preferably 1 to 3 nm, and the wavelength λ is 3 to 30 nm, more preferably 5 to 25 nm, and even more preferably 10 to 15 nm. Both the amplitude and the wavelength depend on the angle of incidence as well as the layer thickness.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
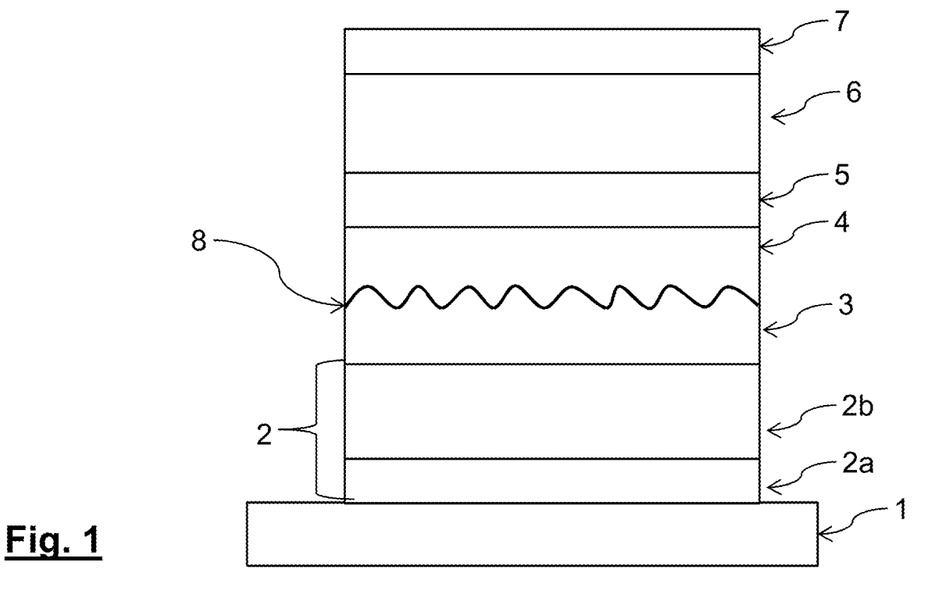
FIG. 1 shows a schematic cross-sectional illustration of a magnetoelectronic device including an antiferromagnetic pinning layer and two ferromagnetic layers.

FIG. 1 schematically illustrates in cross-section the multilayer structure of an embodiment of a magnetoelectronic device produced by the method according to the present invention. The multilayer structure is built onto a base 1, which is preferably a silicon wafer. Onto the base 1 a buffer layer 2 is deposited. The buffer layer 2 may, for example, constitute multiple layers of different, in particular inert or passive, materials, or may, for example, function as a seeding layer. The figure shows a buffer layer 2 which is composed of a first sublayer 2a and a second sublayer 2b. The first sublayer 2a may be a Tantalum layer and the second sublayer 2b may be a Ruthenium layer. It should be noted that if the multilayer structure is to be utilized as sensor stack and, in particular, as a TMR stack, the buffer layer 2 may also be used as bottom electrode. It may then be made to include a thick conductive layer to carry current.

Onto this buffer layer 2 an antiferromagnetic pinning layer 3 is deposited by means of oblique incidence deposition, e.g. by sputtering. This method leads to a particular surface roughness of the antiferromagnetic pinning layer 3 having the form of plane waves. Then, a ferromagnetic layer 4 is deposited onto the surface of the antiferromagnetic pinning layer 3 opposite buffer layer 2, i.e. onto the surface having the surface roughness in the form of plane waves, thereby forming a boundary surface 8. This ferromagnetic layer 4 exhibits unidirectional magnetic anisotropy and constitutes a pinned ferromagnetic layer having the orientation of its unidirectional magnetic anisotropy pinned or fixed by the antiferromagnetic pinning layer 3.

Onto the pinned ferromagnetic layer 4 a nonmagnetic layer 5 is deposited, e.g. by sputtering. Depending on whether the multilayer structure is meant to utilize the giant magnetoresistance effect or the tunnel magnetoresistance effect, the nonmagnetic layer 5 is electrically conductive or electrically insulating.

Onto the nonmagnetic layer 5 a second ferromagnetic layer 6 is deposited, which does not interact with the antiferromagnetic layer 3 or only interacts with the antiferromagnetic layer 3 to such an extent that it is susceptible to external magnetic fields and the orientation of its magnetization or net magnetic moment can be changed by such external magnetic fields. The second ferromagnetic layer 6 may be deposited by means of zero angle deposition or by means of oblique incidence deposition, e.g. by sputtering.

The magnetoelectronic device is completed with a capping layer 7 which is deposited onto the second ferromagnetic layer 6, e.g. by sputtering. The capping layer may be a Tantalum layer, or any other suitable inert layer.

Figure 2A:
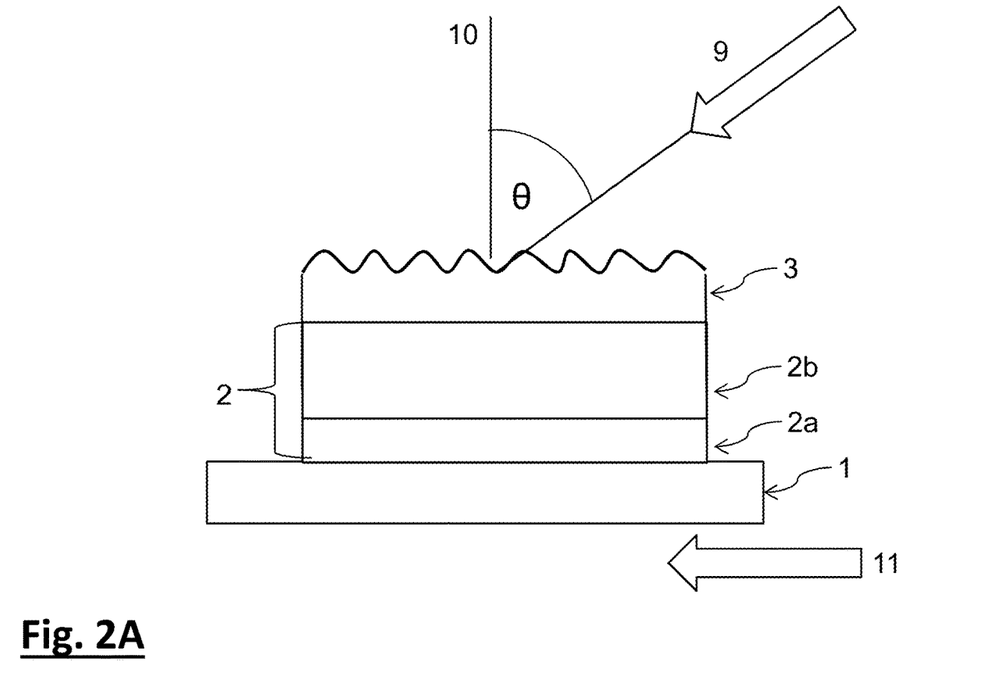
FIGS. 2A and 2B show schematic side and top views, respectively, of an inert substrate and buffer layer onto which an antiferromagnetic pinning layer is deposited by oblique incidence sputter deposition during production of the embodiment of the magnetoelectronic device shown in FIG. 1.

FIG. 2A schematically illustrates the deposition of the antiferromagnetic pinning layer 3 onto the buffer layer 2, which is carried out by means of oblique incidence deposition. The buffer layer 2 may also function as a seed layer. The direction 9 defines the incidence direction of the particles that form the antiferromagnetic pinning layer and is indicated by the arrow. The direction 9 of the incident particles is at a nonzero angle θ with respect to the direction 10 perpendicular to the plane defined by the extension of the antiferromagnetic pinning layer 3. Further, in the illustrated example the deposition is effected at an azimuthal angle α of 0° with respect to a reference direction 11 extending parallel to the plane of extension of the antiferromagnetic pinning layer 3, i.e. the angle between the reference direction 11 and the projection of the direction of incidence 9 onto the plane defined by the extension of the antiferromagnetic pinning layer 3 is zero.

Figure 2B:
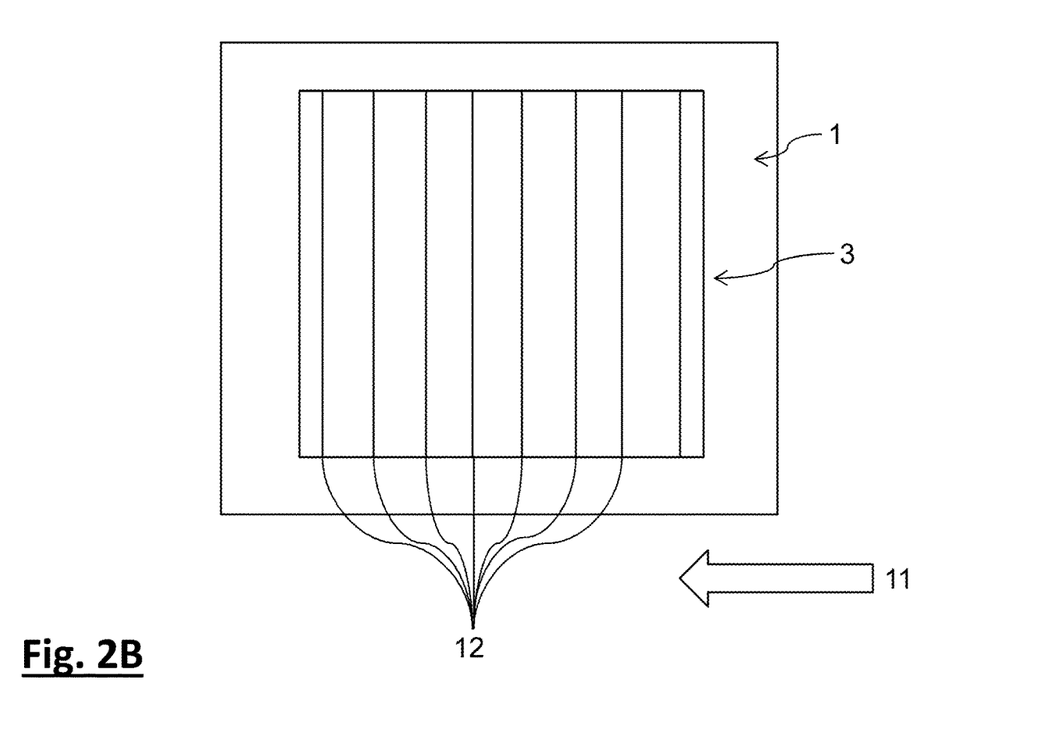

Due to this deposition at a large oblique angle θ of, e.g., 60° the deposited antiferromagnetic pinning layer 3 exhibits a surface roughness. The surface roughness can be described by a periodic function propagating in the direction of the projection of the incidence direction 9 onto the plane of the antiferromagnetic pinning layer 3, the periodic function having an amplitude A and a wavelength λ and, thus, also a frequency f. More precisely, the surface roughness can be described by a plane wave function, the wave fronts 12 forming an angle of 90° with the projection of the direction of incidence onto the plane of the antiferromagnetic pinning layer 3. The wave fronts 12 are the planes which intersect the periodic function at the point of maximal amplitude. The distance between two plane fronts 12 is the wave length λ. The wave fronts 12 are parallel to each other (see FIG. 2B showing a top view onto the surface of the antiferromagnetic pinning layer 3 of FIG. 2A). The amplitude A of the plane wave function is 0.5 to 4 nm, and the wavelength λ of the plane wave function is 5 nm to 25 nm. The amplitude and/or the wavelength may vary within these ranges when traveling along the surface of the antiferromagnetic pinning layer 3 in the propagating direction of the plane waves, i.e. the direction 11 in the illustrated example.

Figure 3:
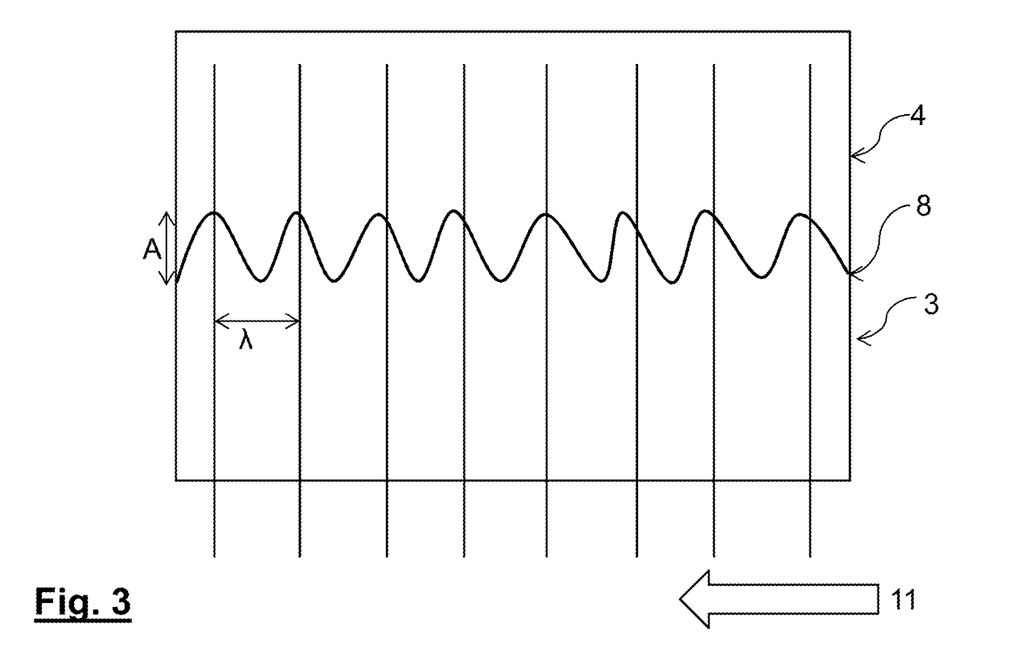
FIG. 3 shows a close up view of a cross-section through the antiferromagnetic pinning layer and the adjacent ferromagnetic layer of the embodiment of the magnetoelectronic device shown in FIG. 1.

FIG. 3 shows a schematic view of a cross-section through the antiferromagnetic pinning layer 3 and the adjacent pinned ferromagnetic layer 4. The shown cross-section is parallel to the plane spanned by the reference direction 11 and the direction of incidence 9. The wave fronts 12 are parallel to the direction 10, which is perpendicular to the plane defined by the extension of the antiferromagnetic pinning layer 3.

Figure 4:
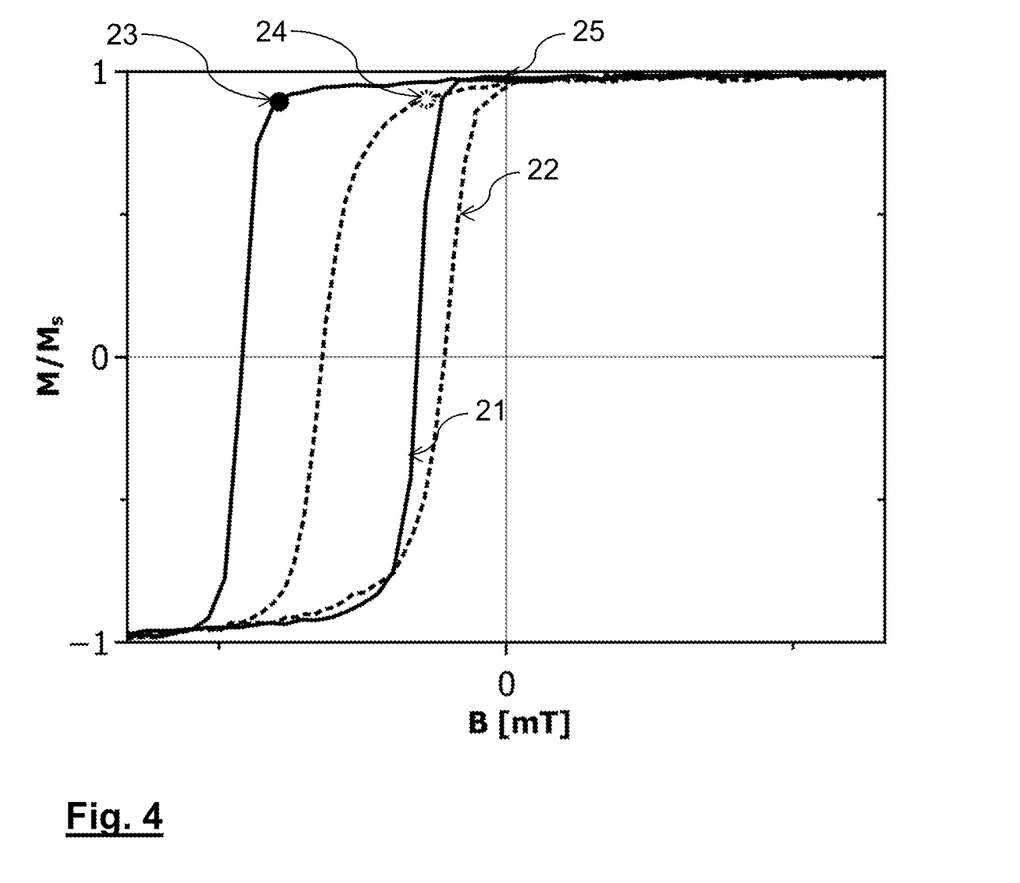
FIG. 4 schematically illustrates a hysteresis curve of a magnetoelectronic device, measured for external magnetic fields oriented parallel and antiparallel to the direction of anisotropy of the pinned ferromagnetic layer.

As noted above, a magnetoelectronic device according to embodiments of the present invention exhibits an improved behavior with an extended usable regime, i.e. an increased absolute magnetic field value. This is illustrated in FIG. 4, which shows two schematic, exemplary hysteresis curves, one hysteresis curve 21 of an embodiment of a magnetoelectronic device according to the present invention, and another hysteresis curve 22 for a comparable magnetoelectronic device, but for which the antiferromagnetic pinning layer 3 was deposited by zero angle deposition. The magnetoelectronic device has the configuration of the magnetoelectronic device illustrated in FIG. 1 without the layers 5 and 6. Both curves 21, 22 correspond to external magnetic fields extending parallel and antiparallel to the direction of the unidirectional magnetic anisotropy of the pinned ferromagnetic layer 4, wherein negative values of the external magnetic field correspond to the antiparallel direction. As can be easily seen, the center of the curve 21 is shifted to the left as compared to the curve 22, and the curve 21 is more square-like than the curve 22. In particular, the point 23 on the curve 21, at which point 23 the magnetization or net magnetic moment of the pinned ferromagnetic layer 4 has dropped to 90% of the remanent value 25 is shifted to higher negative field strengths as compared to the corresponding point 24 on the curve 22. The points 23 and 24 are the absolute magnetic field values for the two curves 21 and 22, respectively, and define their usable regimes. Thus, the usable regime is greatly extended by the use of oblique incidence deposition for the antiferromagnetic pinning layer 3.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of producing a multilayer device, the method comprising:

depositing a multilayer structure including an antiferromagnetic pinning layer (3) and at least one ferromagnetic layer (4), disposed one on top of the other such that each of the at least one ferromagnetic layer (4) is disposed on the same side of the antiferromagnetic pinning layer (3) and a first one of the at least one ferromagnetic layer has a boundary surface (8) with the antiferromagnetic pinning layer (3);

wherein the antiferromagnetic pinning layer (3) or the first ferromagnetic layer is deposited at a respective azimuthal angle (a) with respect to a reference direction (11) extending in the plane of extension of the antiferromagnetic pinning layer (3) and at a nonzero angle of incidence (θ) with respect to a direction (10) perpendicular to the plane of extension of the antiferromagnetic pinning layer (3) in such a manner that the boundary surface (8) has a surface roughness, which can be characterized by a plane wave function propagating in a direction extending in the plane of extension of the antiferromagnetic pinning layer, the plane wave function having an amplitude A and a wavelength λ, wherein the amplitude of the plane wave function is 0.5 to 6 nm and/or the wavelength λ of the plane wave function is 3 nm to 30 nm.

2. The method according to claim 1, wherein the angle of incidence (θ) is greater than 45°.

3. The method according to claim 2, wherein the angle of incidence (θ) is less than 75°.

4. The method of claim 1, wherein the antiferromagnetic pinning layer (3) is chosen from the group consisting of the alloys platinum-manganese and iridium-manganese and of manganese nitride.

5. The method of claim 1, wherein each of the at least one ferromagnetic layer (4) is chosen from the group consisting of Cobalt, Iron, Boron, Nickle and alloys thereof.

6. The method of claim 1, wherein the antiferromagnetic pinning layer (3) is less than 30 nm thick.

7. The method of claim 1, wherein the deposition of the at least one ferromagnetic layer (4) and/or the deposition of the antiferromagnetic pinning layer (3) is carried out by means of ion beam deposition or physical vapor deposition.

8. The method of claim 1, wherein the at least one ferromagnetic layer (4) comprises multiple ferromagnetic layers disposed one on top of the other, wherein each two adjacent ones of the ferromagnetic layers are separated by a respective nonmagnetic layer (5).

9. The method of claim 1, wherein at least one of the ferromagnetic layers (4) is deposited at a respective azimuthal angle with respect to a reference direction (11) extending in the plane of extension of the respective ferromagnetic layer and at a nonzero angle of incidence (θ) with respect to a direction (10) perpendicular to the plane of extension of the respective ferromagnetic layer (4).

10. The method of claim 1, wherein the device is a magnetoelectronic device, preferably a magnetic field sensor.

11. A device producible by the method of claim 1, the device comprising a multilayer structure including an antiferromagnetic pinning layer (3) and at least one ferromagnetic layer (4), disposed one on top of the other such that each of the at least one ferromagnetic layer (4) is disposed on the same side of the antiferromagnetic pinning layer (3) and a first one of the at least one ferromagnetic layer (4) has a boundary surface (8) with the antiferromagnetic pinning layer (3), wherein the boundary surface (8) has a surface roughness, which is characterized by a plane wave function propagating in a direction extending in the plane of extension of the antiferromagnetic pinning layer, the plane wave function having an amplitude A and a wavelength λ, wherein the amplitude of the plane wave function is 0.5 to 6 nm and/or the wavelength λ of the plane wave function is 3 nm to 30 nm.

12. The device of claim 11, wherein the amplitude of the plane wave function is 0.5 to 6 nm and/of the wavelength λ of the plane wave function is 3 nm to 30 nm.

13. The method of claim 1, wherein the amplitude of the plane wave function is 0.5 to 6 nm and the wavelength λ of the plane wave function is 3 nm to 30 nm.

14. A method of producing a multilayer device, the method comprising:
  depositing a multilayer structure including an antiferromagnetic pinning layer (3) and at least one ferromagnetic layer (4), disposed one on top of the other such that each of the at least one ferromagnetic layer (4) is disposed on the same side of the antiferromagnetic pinning layer (3) and a first one of the at least one ferromagnetic layer has a boundary surface (8) with the antiferromagnetic pinning layer (3);
  wherein the antiferromagnetic pinning layer (3) or the first ferromagnetic layer is deposited at a respective azimuthal angle (α) with respect to a reference direction (11) extending in the plane of extension of the antiferromagnetic pinning layer (3) and at a nonzero angle of incidence (θ) with respect to a direction (10) perpendicular to the plane of extension of the antiferromagnetic pinning layer (3) in such a manner that the boundary surface (8) has a surface roughness, which can be characterized by a plane wave function propagating in a direction extending in the plane of extension of the antiferromagnetic pinning layer, the plane wave function having an amplitude A and a wavelength λ, wherein the amplitude of the plane wave function is 0.5 to 6 nm.

15. A device producible by the method of claim 14, the device comprising a multilayer structure including an antiferromagnetic pinning layer (3) and at least one ferromagnetic layer (4), disposed one on top of the other such that each of the at least one ferromagnetic layer (4) is disposed on the same side of the antiferromagnetic pinning layer (3) and a first one of the at least one ferromagnetic layer (4) has a boundary surface (8) with the antiferromagnetic pinning layer (3), wherein the boundary surface (8) has a surface roughness, which is characterized by a plane wave function propagating in a direction extending in the plane of extension of the antiferromagnetic pinning layer, the plane wave function having an amplitude A and a wavelength λ, wherein the amplitude of the plane wave function is 0.5 to 6 nm.

* * * * *